(12) United States Patent
Kim et al.

(10) Patent No.: US 10,748,601 B2
(45) Date of Patent: Aug. 18, 2020

(54) INTEGRATED CIRCUIT CHIP

(71) Applicant: SK hynix Inc., Gyeonggi-do (KR)

(72) Inventors: Ji-Hwan Kim, Seoul (KR); Heat-Bit Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 46 days.

(21) Appl. No.: 16/127,845

(22) Filed: Sep. 11, 2018

(65) Prior Publication Data

US 2019/0198089 A1    Jun. 27, 2019

(30) Foreign Application Priority Data

Dec. 26, 2017    (KR) .................. 10-2017-0179851

(51) Int. Cl.
| | |
|---|---|
| *G11C 7/10* | (2006.01) |
| *G11C 11/4096* | (2006.01) |
| *G11C 5/06* | (2006.01) |
| *G11C 29/36* | (2006.01) |
| *G11C 29/02* | (2006.01) |
| *G11C 5/02* | (2006.01) |
| *G11C 29/12* | (2006.01) |

(52) U.S. Cl.
CPC ............ *G11C 11/4096* (2013.01); *G11C 5/02* (2013.01); *G11C 5/06* (2013.01); *G11C 7/106* (2013.01); *G11C 7/1006* (2013.01); *G11C 7/1066* (2013.01); *G11C 29/022* (2013.01); *G11C 29/36* (2013.01); *G11C 29/023* (2013.01); *G11C 29/1201* (2013.01); *G11C 29/12015* (2013.01)

(58) Field of Classification Search
CPC ......... G11C 11/4096; G11C 5/02; G11C 5/06; G11C 7/1006; G11C 7/106; G11C 7/1066; G11C 29/022; G11C 29/36
See application file for complete search history.

(56) References Cited

U.S. PATENT DOCUMENTS

| | | | | |
|---|---|---|---|---|
| 2014/0355364 A1* | 12/2014 | Park | .................. | G11C 7/10 365/189.17 |
| 2015/0255131 A1* | 9/2015 | Byeon | .................. | G11C 5/04 365/230.03 |
| 2016/0104517 A1* | 4/2016 | Park | .................. | H03K 19/017509 365/189.17 |
| 2017/0162237 A1* | 6/2017 | Lee | .................. | G11C 5/04 |

FOREIGN PATENT DOCUMENTS

| | | |
|---|---|---|
| KR | 101096185 | 12/2011 |
| KR | 1020160147967 | 12/2016 |

* cited by examiner

*Primary Examiner* — Toan K Le
(74) *Attorney, Agent, or Firm* — IP & T Group LLP (57) ABSTRACT

An integrated circuit chip includes: one or more couplers suitable for transferring data between stacked chips; one or more data nodes suitable for transferring data to a host; and one or more transfer circuits on a transfer path for transferring data between the one or more couplers and the one or more data nodes, wherein at least one transfer circuit among the one or more transfer circuits inverts a portion of the data which is transferred by the at least one transfer circuit.

14 Claims, 8 Drawing Sheets

# INTEGRATED CIRCUIT CHIP

CROSS-REFERENCE TO RELATED APPLICATIONS

The present application claims priority under 35 U.S.C. § 119(a) to Korean Patent Application No. 10-2017-0179851, filed on Dec. 26, 2017, which is incorporated herein by reference in its entirety.

BACKGROUND

1. Field

Exemplary embodiments of the present invention relate to an integrated circuit chip.

2. Description of the Related Art

As semiconductor memory technology makes a drastic progress, packaging technology of semiconductor devices also requires high integration and high performance. Accordingly, techniques for three-dimensional (3D) structures for vertically stacking a plurality of integrated circuit chips, other than a two-dimensional (2D) structure are being developed in various ways. According to the two-dimensional structure, integrated circuit chips are planarly arranged on a printed circuit board (PCB) by using wires or bumps.

This three-dimensional structure may be realized in the form of a stacked memory device where a plurality of memory chips are vertically stacked. The memory chips stacked in the vertical direction are electrically connected to each other through a through silicon via (TSV), and mounted on a substrate for a semiconductor package.

SUMMARY

Embodiments of the present invention are directed to a technology for efficiently testing an integrated circuit chip.

In accordance with an embodiment of the present invention, an integrated circuit chip includes: one or more couplers suitable for transferring data between stacked chips; one or more data nodes suitable for transferring data to a host; and one or more transfer circuits on a transfer path for transferring data between the one or more couplers and the one or more data nodes, wherein at least one transfer circuit among the one or more transfer circuits inverts a portion of the data which is transferred by the at least one transfer circuit.

In accordance with another embodiment of the present invention, an integrated circuit chip includes: a first coupler and a second coupler suitable for coupling data between stacked chips; a first transfer circuit suitable for performing a serial-to-parallel conversion onto data of the first coupler and the second coupler to produce a first conversion result and transferring the first conversion result to first to fourth data transfer lines where a portion of the data of the first coupler and the second coupler is inverted and transferred; a second transfer circuit suitable for performing a parallel-to-serial conversion onto data of the first to fourth data transfer lines to produce a second conversion result and transferring the second conversion result to fifth and sixth data transfer lines where a portion of the data of the first to fourth data transfer lines is inverted and transferred; and a third transfer circuit suitable for performing a parallel-to-serial conversion onto data of the fifth and sixth data transfer lines to produce a third conversion result and transferring the third conversion result to a data node.

In accordance with yet another embodiment of the present invention, a memory device includes: a base die that includes one or more data nodes for transferring and receiving data to and from a host, and one or more couplers that are coupled to one or more transfer lines for coupling data between stacked chips; and one or more core dies that are stacked over the base die, transfer and receive data to and from the base die through the one or more transfer lines, and include a cell array for storing data, wherein the base die includes one or more transfer circuits on a transfer path for transferring data from the one or more couplers to the one or more data nodes, and at least one transfer circuit among the one or more transfer circuits inverts a portion of the data which is transferred by the at least one transfer circuit.

In accordance with still yet another embodiment of the present invention, an integrated circuit chip includes: at least one coupler suitable for coupling data transmitted and received between at least two stacked chips; at least one data node suitable for transferring data to a host; and at least one transfer circuit as a transfer path between the at least one coupler and the at least one data node, suitable for converting and transferring data on the transfer path, wherein the data on the transfer path is serial-to-parallel converted or parallel-to-serial converted, and a portion of the data on the transfer path is inverted.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

Hereinafter, the various embodiments of the present invention will be described in detail with reference to the attached drawings.

Figure 1:
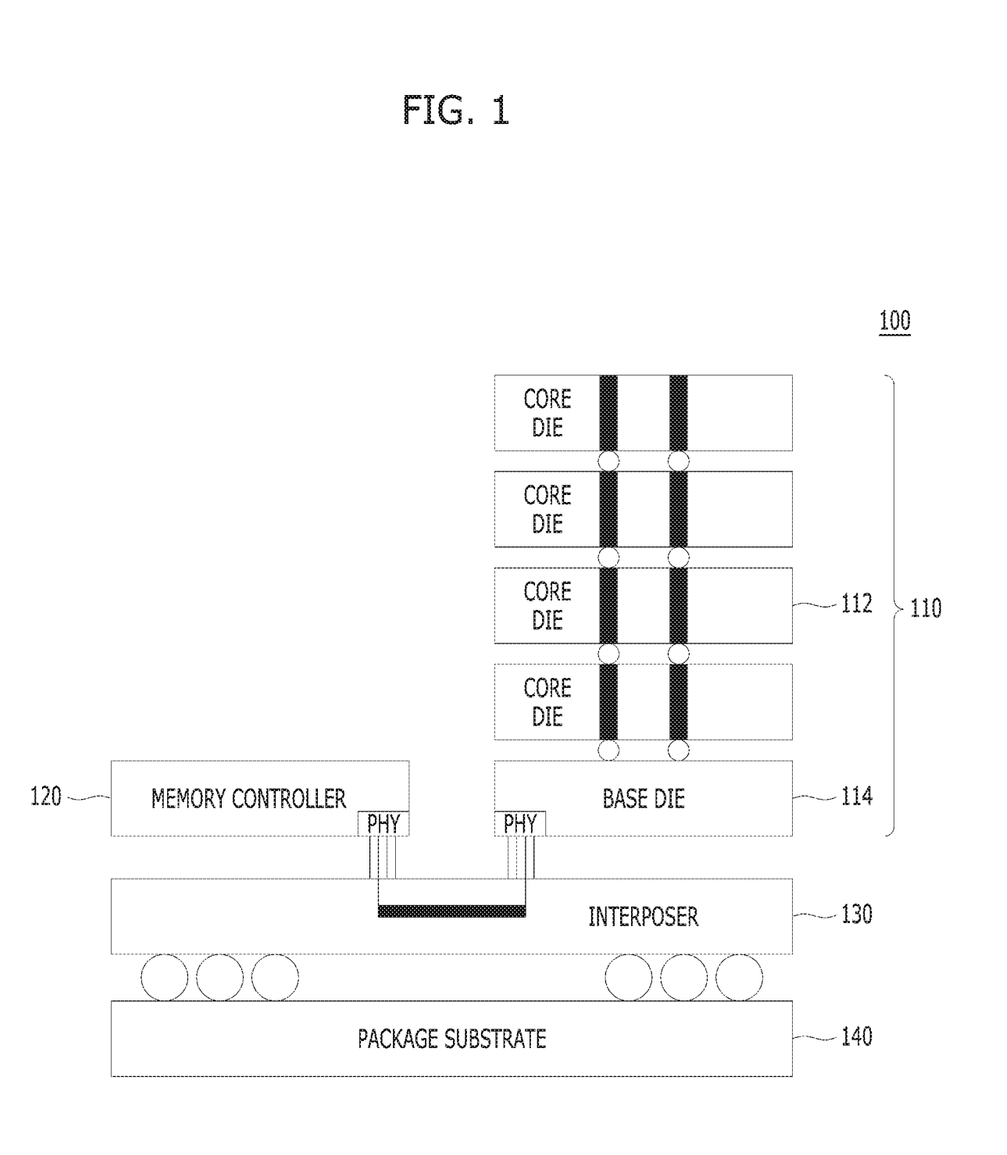
FIG. 1 is a block diagram illustrating a memory system in accordance with an embodiment of the present invention.

FIG. 1 is a block diagram illustrating a memory system 100 in accordance with an embodiment of the present invention.

Referring to FIG. 1, the memory system 100 may include a memory device 110, a memory controller 120, an interposer 130, and a package substrate 140.

The interposer 130 may be formed in the upper portion of the package substrate 140, and the memory device 110 and the memory controller 120 may be formed in the upper portion of the interposer 130. Since the memory controller 120 is generally included in diverse processors such as a central processing unit (CPU), a graphic processing unit (GPU), and an application processor (AP), the memory controller 120 may also be referred to as a processor. The interface PHY of the memory device 110 and the interface PHY of the memory controller 120 may be coupled through the interposer 130. An interface for communication between the memory device 110 and the memory controller 120 is referred to as PHY.

The memory device 110 may be formed to stack a plurality of integrated circuit chips and to electrically connect the integrated circuit chips through a through silicon via (TSV). The integrated circuit chips may include a base die 114 and a plurality of core dies 112. Each of the core dies 112 may have a cell array for storing data and circuits for writing and reading data to and from the cell array. Circuits for interfacing between the core dies 112 and the memory controller 120 may be disposed on the base die 114. When the memory device 110 is formed in this manner, the number of input/output units may be greatly increased, which is advantageous to increase the bandwidth. By way of example and not limitation, the memory device 110 formed as described above may be a high bandwidth memory (HBM).

Figure 2:
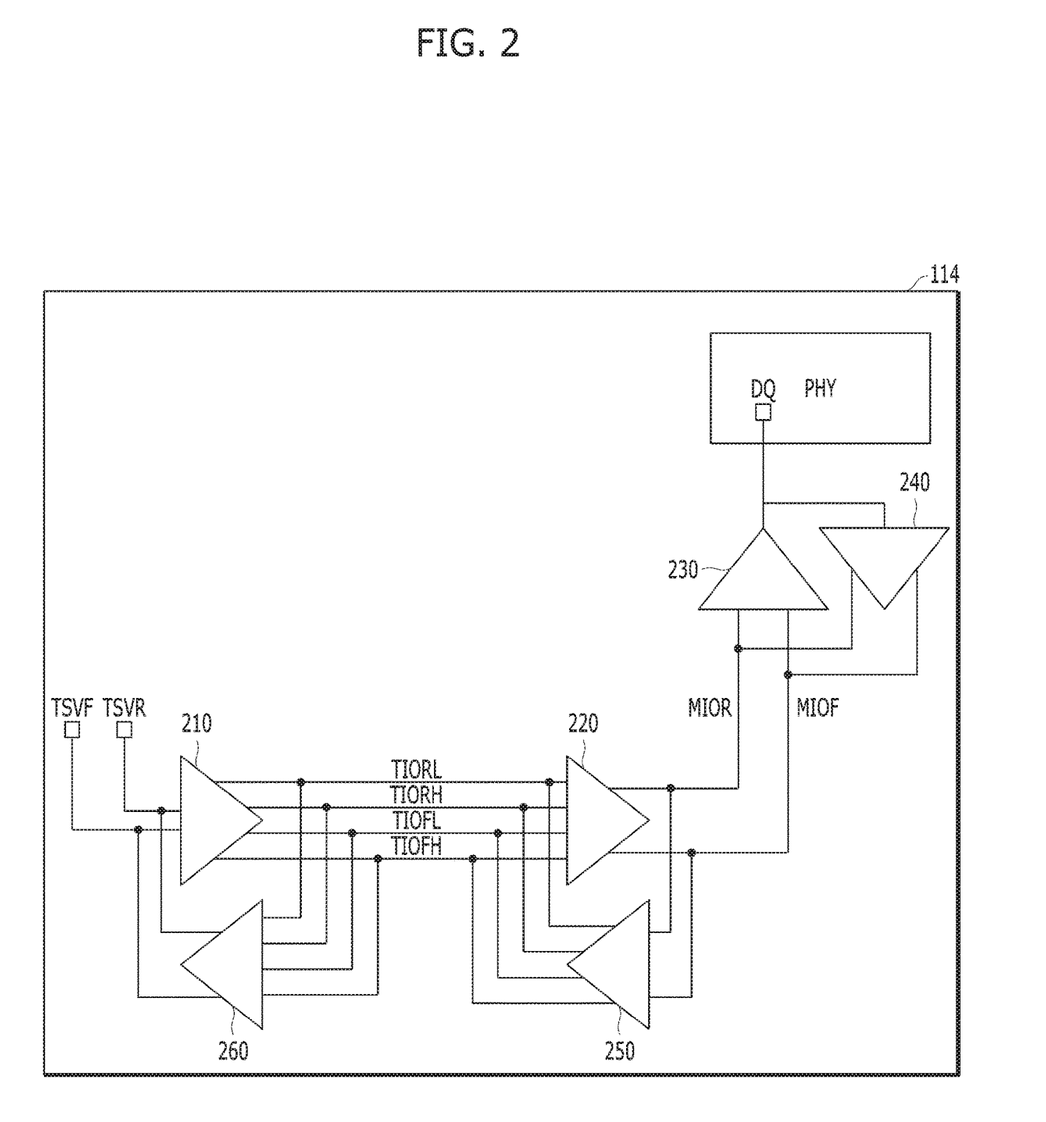
FIG. 2 is a block diagram illustrating a base die of a memory device in accordance with an embodiment of the present invention.

FIG. 2 is a block diagram illustrating a base die of a memory device in accordance with the embodiment of the present invention, for example, the base die 114 of the memory device 110 in FIG. 1. FIG. 2 shows only the portion that is directly related to the transfer of data in the base die 114.

Referring to FIG. 2, the base die 114 may include couplers TSVR and TSVF, a data node DQ, a first transfer circuit 210, a second transfer circuit 220, a third transfer circuit 230, a fourth transfer circuit 240, a fifth transfer circuit 250, and a sixth transfer circuit 260.

The data node DQ may be a node for transferring and receiving data to and from a host, i.e., the memory controller 120 of FIG. 1. The data node DQ may be coupled to a micro bump may be coupled to the interposer 130, and may be coupled to the interface PHY of the memory controller 120 through the interposer 130. In the interface PHY area of the base die 114, there may be hundreds or thousands of data nodes DQ. In FIG. 2, only one data node DQ is shown.

The first coupler TSVR and the second coupler TSVF may be nodes for transferring and receiving data with chips stacked on the base die 114, that is, core dies 112. Each of the couplers TSVR and TSVF may be coupled to a through silicon via (TSV). There may be a number of couplers TSVR and TSVF in the base die 114, and only the couplers TSVR and TSVF corresponding to one data node DQ are shown in FIG. 2.

The first transfer circuit 210, the second transfer circuit 220 and the third transfer circuit 230 may be circuits for transferring data from the couplers TSVR and TSVF to the data node DQ. The first to third transfer circuits 210, 220, and 230 may be used to transfer the data that is read from the core dies 112 to the memory controller 120 during a read operation.

The first transfer circuit 210 may transfer data of the first coupler TSVR and the second coupler TSVF to the first to fourth data transfer lines TIORL, TIOFL, TIORH, and TIOFH. The first transfer circuit 210 may perform a serial-to-parallel conversion onto the data of the first coupler TSVR and the second coupler TSVF in 2:4, that is, 1:2, and output the result to the first to fourth data transfer lines TIORL, TIOFL, TIORH, and TIOFH. The second transfer circuit 220 may perform a parallel-to-serial conversion onto the data of the first to fourth data transfer lines TIORL, TIOFL, TIORH, and TIOFH in 4:2, that is, 2:1, and transfer the result to fifth and sixth data transfer lines MIOR and MIOF. The third transfer circuit 230 may perform a parallel-to-serial conversion onto the data of the fifth and sixth data transfer lines MIOR and MIOF in 2:1 and transfer the result to the data node DQ.

The fourth transfer circuit 240, the fifth transfer circuit 250 and the sixth transfer circuit 260 may be circuits for transferring data from the data node DQ to the couplers TSVR and TSVF. The fourth to sixth transfer circuits 240, 250, and 260 may be used to transfer a write data transferred from the memory controller 120 to the core dies 112 during a write operation.

The fourth transfer circuit 240 may perform a serial-to-parallel conversion onto the data of the data node DQ in 1:2 and transfer the result to the fifth and sixth data transfer lines MIOR and MIOF. The fifth transfer circuit 250 may perform a serial-to-parallel conversion onto the data of the fifth and sixth data transfer lines MIOR and MIOF in 2:4, i.e., 1:2, to transfer the result to the first to fourth data transfer lines TIORL, TIOFL, TIORH, and TIOFH. The sixth transfer circuit 260 may perform a parallel-to-serial conversion onto the data of the first to fourth data transfer lines TIORL, TIOFL, TIORH, and TIOFH in 4:2, that is, 2:1, and transfer the result to the first coupler TSVR and the second coupler TSVF.

The base die 114 and the core dies 112 of the memory device 110 may be fabricated separately and then coupled. In this case, they have to be individually tested before they are coupled. Thus, the base die 114 may also be tested before it is coupled with the core dies 112. In order to increase the test efficiency of the base die 114, a path from the couplers TSVR and TSVF to the data node DQ, may be designed to invert and transfer a portion of data. In other words, at least one among the transfer circuits 210, 220, and 230 on a path through which the read data is transferred from the base die 114 may be designed to invert and transfer a portion of data. For example, the first transfer circuit 210 and the second transfer circuit 220 may be designed to invert and transmit a portion of the data that they transfer.

Figure 3:
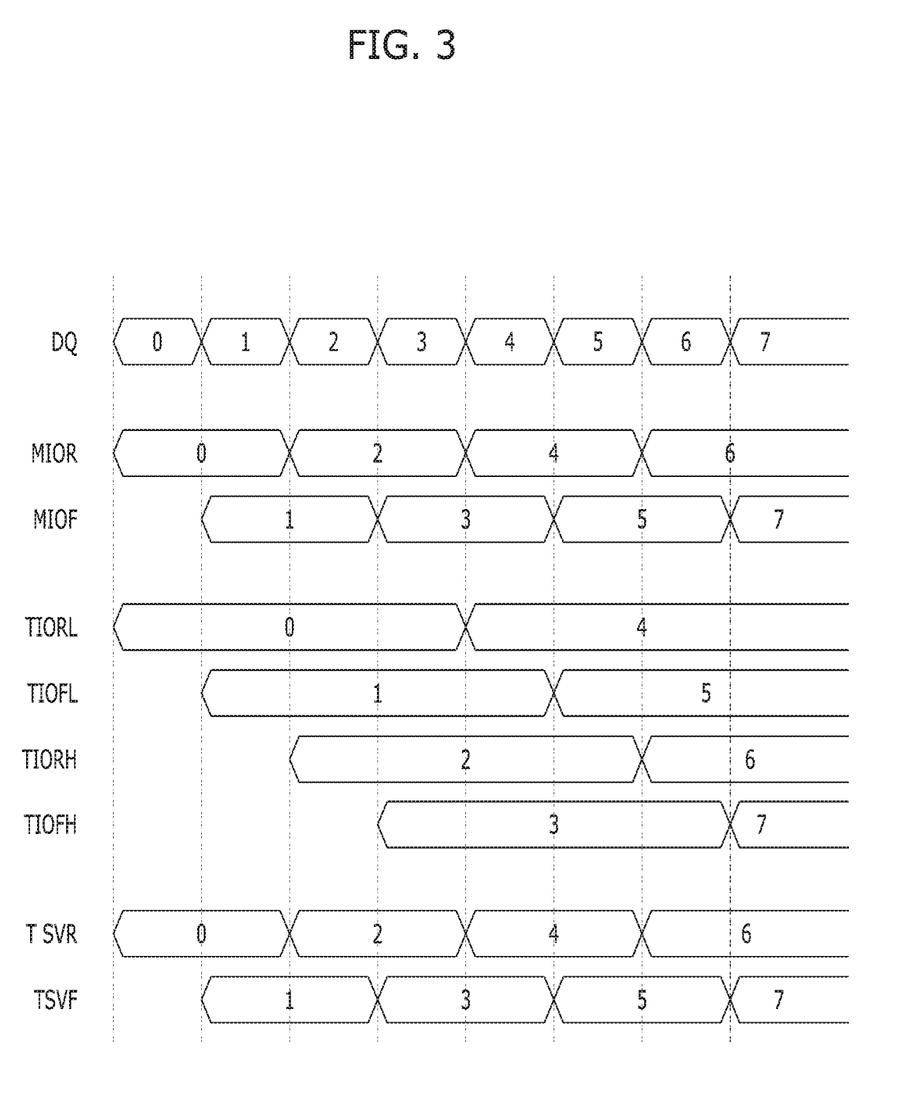
FIG. 3 is a timing diagram illustrating a process of testing a write operation of a base die in accordance with an embodiment of the present invention.
Figure 4:
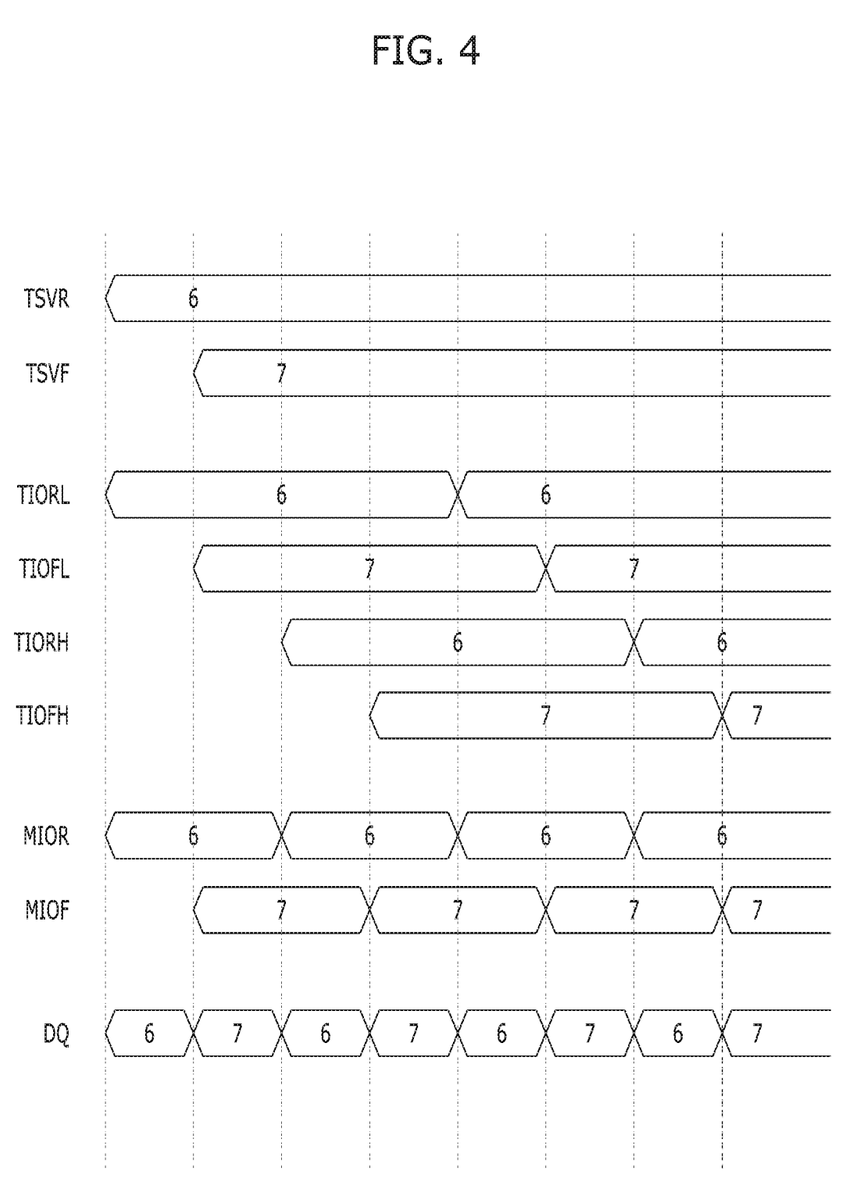
FIGS. 4 and 5 are timing diagrams illustrating a process of testing a read operation of a base die in accordance with an embodiment of the present invention.
Figure 5:
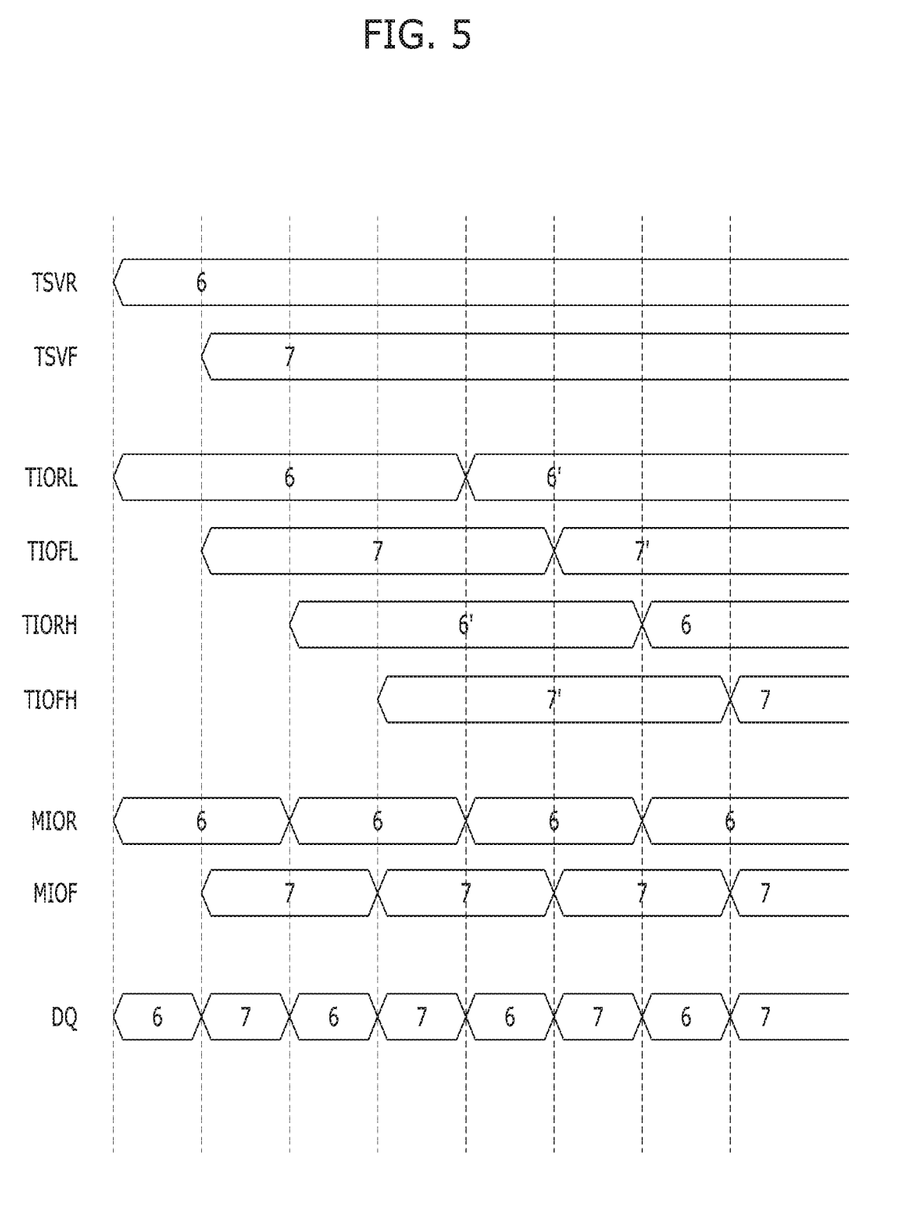

Referring to FIGS. 3 to 5, the reason why at least one of the transfer circuits 210, 220, and 230 inverts a portion of the data transferred by the transfer circuits 210, 220, and 230 will be described. The base die 114 alone may perform the test process illustrated in FIGS. 3 to 5 without being coupled with the core dies 112.

FIG. 3 is a timing diagram illustrating a process of testing a write operation of a base die in accordance with an embodiment of the present invention, for example, the base die 114 in FIG. 2. Referring to FIG. 3, eight data 0 to 7 that are inputted to the data node DQ may be serial-to-parallel converted in 1:2 and transferred to the fifth and sixth data transfer lines MIOR and MIOF. The data of the fifth and sixth data transfer lines MIOR and MIOF may be serial-to-parallel converted in 1:2 and transferred to the first to fourth data transfer lines TIORL, TIOFL, TIORH, and TIOFH. The data of the first to fourth data transfer lines TIORL, TIOFL, TIORH, and TIOFH may be parallel-to-serial converted in 2:1 and transferred to the first coupler TSVR and the second coupler TSVF.

FIG. 4 is a timing diagram illustrating a process of testing a read operation of a base die in accordance with an embodiment of the present invention, for example, the base die 114 in FIG. 2. The process of FIG. 4 may be performed after the process of FIG. 3. In FIG. 4, it is assumed that none of the transfer circuits 210, 220, and 230 performs the operation of inverting a portion of data. Referring to FIG. 4, it may be seen that data 6 is continuously loaded on the first coupler TSVR and data 7 is continuously loaded on the second coupler TSVF. Since a read operation is performed after a write operation is performed by only the base die 114 without the core dies 112, only the lastly written data 6 and 7 during the write operation remain in the first coupler TSVR and the second coupler TSVF, respectively. When the read operation is performed in this state, only the data 6 and 7 remaining in the first coupler TSVR and the second coupler TSVF may be transferred to the first to fourth data transfer lines TIORL, TIOFL, TIORH, and TIOFH and then be transferred to the fifth and sixth data transfer lines MIOR and MIOF. In this case, since only a very monotonous pattern of data is transferred to the first to sixth transfer lines TIORL, TIOFL, TIORH, TIOFH, MIOR, and MIOF, there may be difficulty in verifying whether the first to third transfer circuits 210 to 230 involving in a read operation operate properly or not. Particularly, since only the same data are loaded on the first to sixth data transfer lines TIORL, TIOFL, TIORH, TIOFH, MIOR, and MIOF, it is difficult to verify whether the first transfer circuit 210 and the second transfer circuit 220 transfer data properly or not.

FIG. 5 is a timing diagram illustrating a process of testing a read operation of a base die in accordance with an embodiment of the present invention, for example, the base die 114. The process of FIG. 5 may be performed after the process of FIG. 3. In FIG. 5, it is assumed that the first transfer circuit 210 and the second transfer circuit 220 perform the operation of inverting a portion of the transferred data in order to increase the efficiency of the test. Referring to FIG. 5, it may be seen that the data 6 is continuously loaded on the first coupler TSVR, and the data 7 is continuously loaded on the second coupler TSVF. Since the read operation is performed after the write operation is performed only by the base die 114 without the core dies 112, only the lastly written data 6 and 7 during the write operation may remain in the first coupler TSVR and the second coupler TSVF, respectively. The first transfer circuit 210 may invert a portion of the data transferred by the first transfer circuit 210, and transfer the inverted data to the first to fourth data transfer lines TIORL, TIOFL, TIORH, and TIOFH. Therefore, differently from FIG. 4, not the same data but data of a toggling pattern may be continuously loaded on the first to fourth data transfer lines TIORL, TIOFL, TIORH, and TIOFH in FIG. 5. In FIG. 5, a data with an apostrophe (') may represent an inverted data. For example, the data 6' may represent an inverted data of data 6, and the data 7' may represent an inverted data of data 7. The second transfer circuit 220 may invert a portion of the data loaded on the first to fourth data transfer lines TIORL, TIOFL, TIORH, and TIOFH and transfer the inverted data to the fifth and sixth data transfer lines MIOR and MIOF. For example, the second transfer circuit 220 may invert a portion of the data loaded on the third to fourth data transfer lines TIORH and TIOFH (e.g., 6' and 7'). The third transfer circuit 230 may perform a parallel-to-serial conversion onto the data of the fifth and sixth data transfer lines MIOR and MIOF in 2:1 and transfer the result to the data node DQ.

It is shown in FIG. 5 that as at least one circuit among the first to third transfer circuits 210, 220, and 230 (i.e., 210 and 220) inverts a portion of data transferred by the circuit, the data patterns of the first to sixth data transfer lines TIORL, TIOFL, TIORH, TIOFH, MIOR, and MIOF are more diverse than those shown in FIG. 4. Thus, the write operation test of the base die 114 may be performed more efficiently. Although FIG. 5 illustrates that the first transfer circuit 210 and the second transfer circuit 220 among the first to third transfer circuits 210, 220, and 230 invert a portion of the data, it is also possible for only one circuit among the first to third transfer circuits 210, 220, and 230 to invert a portion of the data or for all the first to third transfer circuits 210, 220, and 230 to invert a portion of the data.

Figure 6:
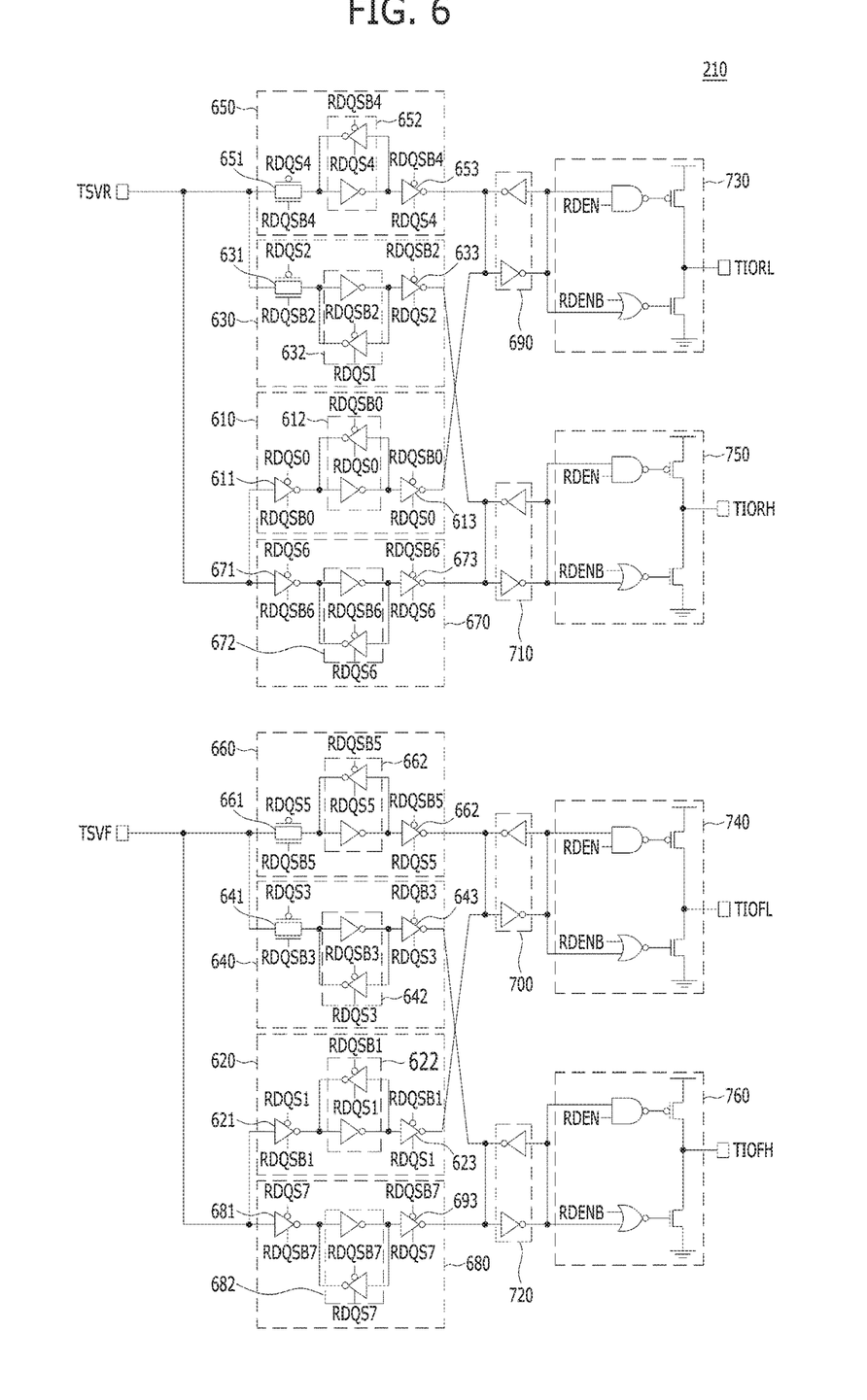
FIG. 6 is a block diagram illustrating a first transfer circuit in accordance with an embodiment of the present invention.

FIG. 6 is a block diagram illustrating a first transfer circuit in accordance with an embodiment of the present invention, for example, the first transfer circuit 210 of FIG. 2. FIG. 6 describes the first transfer circuit 210 that operates the same as that of FIG. 5.

Figure 7:
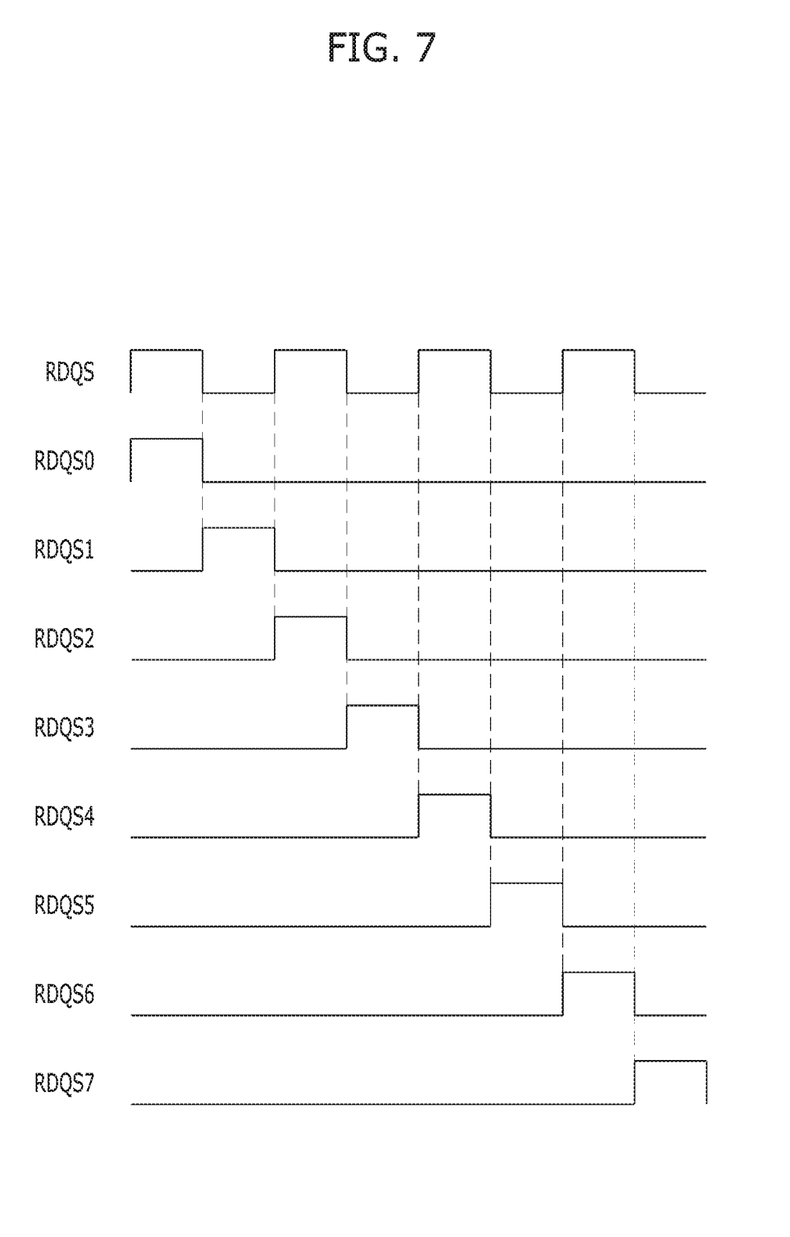
FIG. 7 is a timing diagram illustrating a data strobe signal and first to 8th strobe signals in accordance with an embodiment of the present invention.

The first transfer circuit 210 may transfer the data of the first coupler TSVR and the second coupler TSVF to the first to fourth data transfer lines TIORL, TIOFL, TIORH, and TIOFH in synchronization with the first to eighth strobe signals RDQS0 to RDQS7. The first transfer circuit 210 may transfer the data synchronized with the four strobe signals RDQS0, RDQS1, RDQS6, and RDQS7, whereas they may invert and transfer the data synchronized with the four strobe signals RDQS2, RDQS3, RDQS4, and RDQS5. In short, the first transfer circuit 210 may transfer the four data out of the eight data transferred by itself as they are, while inverting and transferring the other four data. The first to eighth strobe signals RDQS0 to RDQS7 may be generated by dividing the data strobe signal RDQS used in a read operation, and their activation periods do not overlap with each other. Referring to FIG. 7, the data strobe signal RDQS and the first to eighth strobe signals RDQS0 to RDQS7 may be understood.

Referring to FIG. 6, the first transfer circuit 210 may include first to eighth transfer units 610 to 680, first to fourth latches 690 to 720, and first to fourth drivers 730 to 760.

The first transfer unit 610 may invert the data of the first coupler TSVR and transfer the inverted data to the first latch 690 in response to the first strobe signal RDQS0. A three-phase inverter 611 may be turned on while the first strobe signal RDQS0 is inactivated to a logic low level. When the first strobe signal RDQS0 is activated to a logic high level, the three-phase inverter 611 may be turned off and a latch 612 is activated and a three-phase inverter 613 may be activated. Through these operations, the data synchronized with the first strobe signal RDQS0 may be inverted and transferred to the first latch 690.

The second transfer unit 620 may invert the data of the second coupler TSVF and transfer the inverted data to the second latch 700 in response to the second strobe signal RDQS1. A three-phase inverter 621 may be turned on while the second strobe signal RDQS1 is inactivated to a logic low level. When the second strobe signal RDQS1 is activated to a logic high level, the three-phase inverter 621 may be turned off and a latch 622 may be activated and a three-phase inverter 623 may be activated. Through these operations, the data synchronized with the second strobe signal RDQS1 may be inverted and transferred to the second latch 700.

The third transfer unit 630 may transfer the data of the first coupler TSVR to the third latch 710 in response to the third strobe signal RDQS2. A pass gate 631 may be turned on while the third strobe signal RDQS2 is inactivated to a logic low level. When the third strobe signal RDQS2 is activated to a logic high level, the pass gate 631 may be turned off and a latch 632 may be activated and a three-phase inverter 633 may be activated. Through these operations, the data synchronized with the third strobe signal RDQS2 may be transferred to the third latch 710.

The fourth transfer unit 640 may transfer the data of the second coupler TSVF to the fourth latch 720 in response to the fourth strobe signal RDQS3. A pass gate 641 may be turned on while the fourth strobe signal RDQS3 is inactivated to a logic low level. When the fourth strobe signal RDQS3 is activated to a logic high level, the pass gate 641 may be turned off and a latch 642 may be activated and a three-phase inverter 643 may be activated. Through these operations, the data synchronized with the fourth strobe signal RDQS3 may be transferred to the fourth latch 720.

The fifth transfer unit 650 may transfer the data of the first coupler TSVR to the first latch 690 in response to the fifth strobe signal RDQS4. A pass gate 651 may be turned on while the fifth strobe signal RDQS4 is inactivated to a logic low level. When the fifth strobe signal RDQS4 is activated to a logic high level, the pass gate 651 may be turned off and a latch 652 may be activated and a three-phase inverter 653 may be activated. Through these operations, the data synchronized with the fifth strobe signal RDQS4 may be transferred to the first latch 690.

The sixth transfer unit 660 may transfer the data of the second coupler TSVF to the second latch 700 in response to the sixth strobe signal RDQS5. A pass gate 661 may be turned on while the sixth strobe signal RDQS5 is inactivated to a logic low level. When the sixth strobe signal RDQS5 is activated to a logic high level, the pass gate 661 may be turned off and a latch 662 may be activated and a three-phase inverter 663 may be activated. Through these operations, the data synchronized with the sixth strobe signal RDQS5 may be transferred to the second latch 700.

The seventh transfer unit 670 may transfer the data of the first coupler TSVR to the third latch 710 in response to the seventh strobe signal RDQS6. A three-phase inverter 671 may be turned on while the seventh strobe signal RDQS6 is inactivated to a logic low level. When the seventh strobe signal RDQS6 is activated to a logic high level, the three-phase inverter 671 may be turned off and a latch 672 may be activated and a three-phase inverter 673 may be activated. Through these operations, the data synchronized with the seventh strobe signal RDQS6 may be inverted and transferred to the third latch 710.

The eighth transfer unit 680 may transfer the data of the second coupler TSVF to the fourth latch 720 in response to the eighth strobe signal RDQS7. A three-phase inverter 681 may be turned on while the eighth strobe signal RDQS7 is inactivated to a logic low level. When the eighth strobe signal RDQS7 is activated to a logic high level, the three-phase inverter 681 may be turned off and a latch 682 may be activated and a three-phase inverter 683 may be activated. Through these operations, the data synchronized with the eighth strobe signal RDQS7 may be inverted and transferred to the fourth latch 720.

The first latch 690 may latch and invert the data transferred from the first transfer unit 610 and the fifth transfer unit 650 and transfer the inverted data to the first driver 730. The first driver 730 may drive the data received from the first latch 690 to the first data transfer line TIORL. A read enable signal RDEN may be a signal that is activated in a read operation. The first driver 730 may be activated during a read operation in which the read enable signal RDEN is activated to a logic high level and the read enable signal RDENB is activated to a logic low level.

The second latch 700 may latch and invert the data transferred from the second transfer unit 620 and the sixth transfer unit 660 and transfer the inverted data to the second driver 740. The second driver 740 may drive the data received from the second latch 700 to the second data transfer line TIOFL. A read enable signal RDEN may be a signal that is activated in a read operation. The second driver 740 may be activated during a read operation in which the read enable signal RDEN is activated to a logic high level and the read enable signal RDENB is activated to a logic low level.

The third latch 710 may latch and invert the data transferred from the third transfer unit 630 and the seventh transfer unit 670 and transfer the inverted data to the third driver 750. The third driver 750 may drive the data received from the third latch 710 to the third data transfer line TIORH. A read enable signal RDEN may be a signal that is activated in a read operation. The third driver 750 may be activated during a read operation in which the read enable signal RDEN is activated to a logic high level and the read enable signal RDENB is activated to a logic low level.

The fourth latch 720 may latch and invert the data transferred from the fourth transfer unit 640 and the eighth transfer unit 680 and transfer the inverted data to the fourth driver 760. The fourth driver 760 may drive the data received from the fourth latch 720 to the fourth data transfer line TIOFH. A read enable signal RDEN may be a signal that is activated in a read operation. The fourth driver 760 may be activated during a read operation in which the read enable signal RDEN is activated to a logic high level and the read enable signal RDENB is activated to a logic low level.

Figure 8:
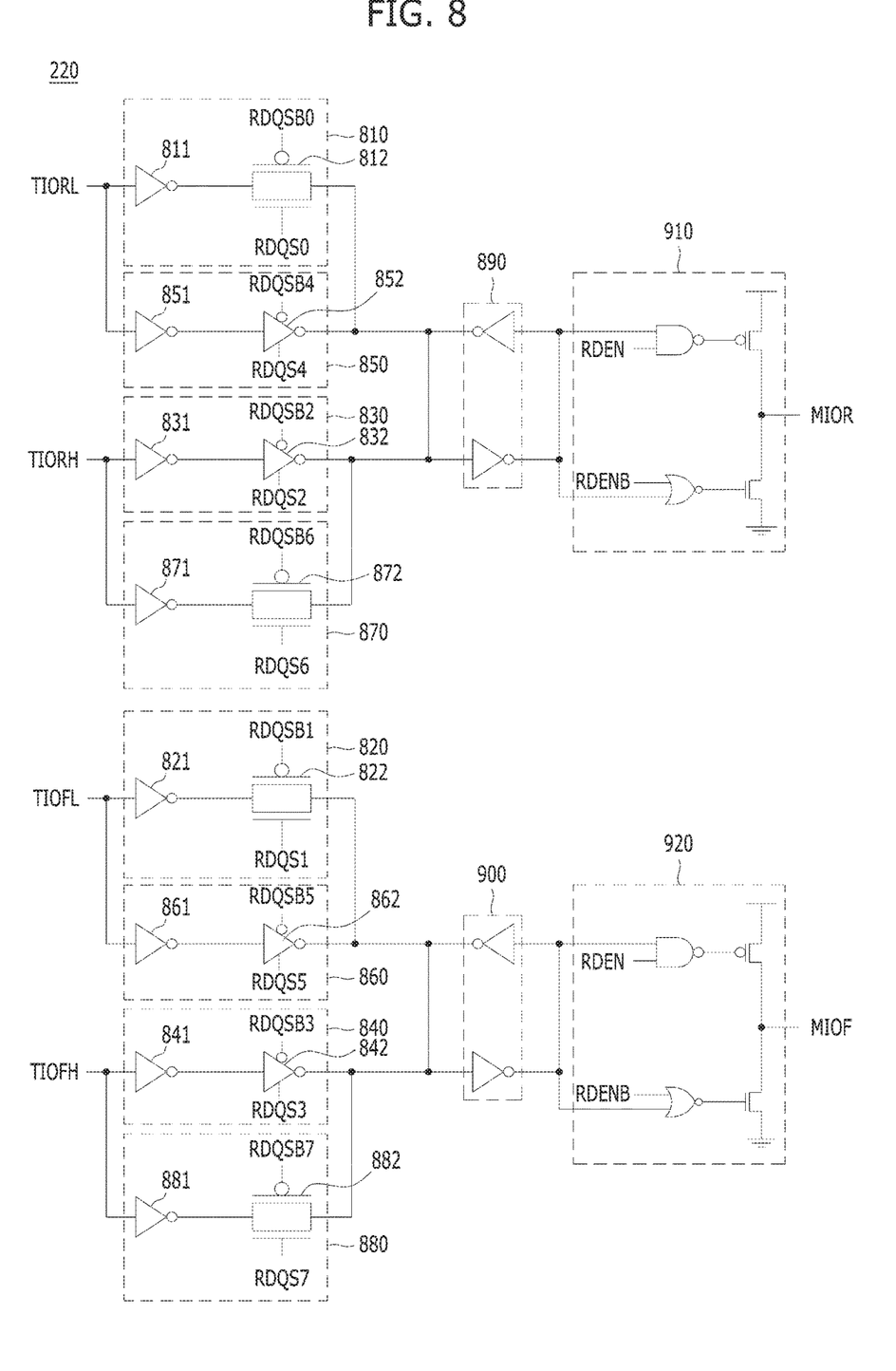
FIG. 8 is a block diagram illustrating a second transfer circuit in accordance with an embodiment of the present invention.

FIG. 8 is a block diagram illustrating a second transfer circuit in accordance with an embodiment of the present invention, for example, the second transfer circuit 220 of FIG. 2. In FIG. 8, the second transfer circuit 220 operating as shown in FIG. 5 is described.

The second transfer circuit 220 may output the data of the first to fourth data transfer lines TIORL, TIOFL, TIORH, and TIOFH to the fifth and sixth data transfer lines MIOR and MIOF in synchronization with the first to eighth strobe signals RDQS0 to RDQS7. The second transfer circuit 220 may transfer the data synchronized with the four strobe signals RDQS0, RDQS1, RDQS6, and RDQS7, whereas they may invert and transfer the data synchronized with the other four strobe signals RDQS2, RDQS3, RDQS4, and RDQS5. In short, the second transfer circuit 220 may transfer four data among the eight data transferred by the second transfer circuit 220 as they are, while inverting and transferring the other four data.

Referring to FIG. 8, the second transfer circuit 220 may include ninth to 16$^{th}$ transfer units 810 to 880, fifth to sixth latches 890 and 900, and fifth to sixth drivers 910 and 920.

The ninth transfer unit 810 may invert the data of the first data transfer line TIORL and transfer the inverted data to the fifth latch 890 in response to the first strobe signal RDQS0. A pass gate 812 may be turned on while the first strobe signal RDQS0 is activated to a logic high level, and the data of the first data transfer line TIORL may be transferred to the fifth latch 890 through an inverter 811 and the pass gate 812.

The 10$^{th}$ transfer unit 820 may invert the data of the second data transfer line TIOFL and transfer the inverted data to the sixth latch 900 in response to the second strobe signal RDQS1. A pass gate 822 may be turned on while the second strobe signal RDQS1 is activated to a logic high level, and the data of the second data transfer line TIOFL may be transferred to the sixth latch 900 through an inverter 821 and the pass gate 822.

The 11$^{th}$ transfer unit 830 may transfer the data of the third data transfer line TIORH to the fifth latch 890 in response to the third strobe signal RDQS2. A three-phase inverter 832 may be turned on while the third strobe signal RDQS2 is activated to a logic high level, and the data of the third data transfer line TIORH may be transferred to the fifth latch 890 through an inverter 831 and the three-phase inverter 832.

The 12$^{th}$ transfer unit 840 may transfer the data of the fourth data transfer line TIOFH to the sixth latch 900 in response to the fourth strobe signal RDQS3. A three-phase inverter 842 may be turned on while the fourth strobe signal RDQS3 is activated to a logic high level, and the data of the fourth data transfer line TIOFH may be transferred to the sixth latch 900 through an inverter 841 and the three-phase inverter 842.

The 13$^{th}$ transfer unit 850 may transfer the data of the first data transfer line TIORL to the fifth latch 890 in response to the fifth strobe signal RDQS4. A three-phase inverter 852 may be turned on while the fifth strobe signal RDQS4 is activated to a logic high level, and the data of the first data transfer line TIORL may be transferred to the fifth latch 890 through an inverter 851 and the three-phase inverter 852.

The 14$^{th}$ transfer unit 860 may transfer the data of the second data transfer line TIOFL to the sixth latch 900 in response to the sixth strobe signal RDQS5. A three-phase inverter 862 may be turned on while the sixth strobe signal RDQS5 is activated to a logic high level, and the data of the second data transfer line TIOFL may be transferred to the sixth latch 900 through an inverter 861 and the three-phase inverter 862.

The 15$^{th}$ transfer unit 870 may transfer the data of the third data transfer line TIORH to the fifth latch 890 in response to the seventh strobe signal RDQS6. A pass gate 872 may be turned on while the seventh strobe signal RDQS6 is activated to a logic high level, and the data of the third data transfer line TIORH may be transferred to the fifth latch 890 through an inverter 871 and the pass gate 872.

The 16$^{th}$ transfer unit 880 may invert the data of the fourth data transfer line TIOFH and transfer the inverted data to the sixth latch 900 in response to the eighth strobe signal RDQS7. A pass gate 882 may be turned on while the eighth strobe signal RDQS7 is activated to a logic high level, and the data of the fourth data transfer line TIOFH may be transferred to the sixth latch 900 through an inverter 881 and the pass gate 882.

The fifth latch 890 may latch and invert the data transferred from the ninth transfer unit 810, the 11$^{th}$ transfer unit 830, the 13$^{th}$ transfer unit 850 and the 15$^{th}$ transfer unit 870, and transfer the inverted data to the fifth driver 910. The fifth driver 910 may drive the data received from the fifth latch 890 to the fifth data transfer line MIOR. A read enable signal RDEN may be a signal that is activated in a read operation. The fifth driver 910 may be activated during a read operation in which the read enable signal RDEN is activated to a logic high level and the read enable signal RDENB is activated to a logic low level.

The sixth latch 900 may latch and invert the data transferred from the 10$^{th}$ transfer unit 820, the 12$^{th}$ transfer unit 840, the 14$^{th}$ transfer unit 860 and the 16$^{th}$ transfer unit 880, and transfer the inverted data to the sixth driver 920. The sixth driver 920 may drive the data received from the sixth latch 900 to the sixth data transfer line MIOF. A read enable signal RDEN may be a signal that is activated in a read operation. The sixth driver 920 may be activated during a read operation in which the read enable signal RDEN is activated to a logic high level and the read enable signal RDENB is activated to a logic low level.

According to the embodiments of the present invention, an integrated circuit chip may be efficiently tested.

While the present invention has been described with respect to the specific embodiments, it will be apparent to those skilled in the art that various changes and modifications may be made without departing from the spirit and scope of the invention as defined in the following claims.

What is claimed is:

1. An integrated circuit chip, comprising:
   a first coupler and a second coupler suitable for coupling data between stacked chips;
   a first transfer circuit suitable for performing a serial-to-parallel conversion onto data of the first coupler and the second coupler to produce a first conversion result and transferring the first conversion result to first to fourth data transfer lines where a portion of the data of the first coupler and the second coupler is inverted and transferred;
   a second transfer circuit suitable for performing a parallel-to-serial conversion onto data of the first to fourth data transfer lines to produce a second conversion result and transferring the second conversion result to fifth and sixth data transfer lines where a portion of the data of the first to fourth data transfer lines is inverted and transferred; and
   a third transfer circuit suitable for performing a parallel-to-serial conversion onto data of the fifth and sixth data transfer lines to produce a third conversion result and transferring the third conversion result to a data node.

2. The integrated circuit chip of claim 1, wherein the first transfer circuit transfers the data of the first coupler and the second coupler to the first to fourth data transfer lines based on first to eighth strobe signals that are activated at different moments, and
   the first transfer circuit transfers data corresponding to four strobe signals among the first to eighth strobe signals to the first to fourth data transfer lines without an inversion, and transfers data corresponding to the other four strobe signals among the first to eighth strobe signals to the first to fourth data transfer lines after inverting the data corresponding to the other four strobe signals.

3. The integrated circuit chip of claim 2, wherein the second transfer circuit transfers the data of the first to fourth data transfer lines based on the first to eighth strobe signals that are activated at different moments to the fifth and sixth data transfer lines, and the second transfer circuit transfers the data corresponding to the four strobe signals among the first to eighth strobe signals to the fifth and sixth data transfer lines without an inversion and transfers the data corresponding to the other four strobe signals among the first to eighth strobe signals to the fifth and sixth data transfer lines after inverting the data corresponding to the other four strobe signals.

4. The integrated circuit chip of claim 3, wherein the second transfer circuit inverts the data that are inverted and transferred by the first transfer circuit.

5. The integrated circuit chip of claim 2, wherein the first transfer circuit includes:
first to fourth latches;
a first transfer unit suitable for inverting data of the first coupler and transferring an inverted data to the first latch in response to the first strobe signal;
a second transfer unit suitable for inverting data of the second coupler and transferring an inverted data to the second latch in response to the second strobe signal;
a third transfer unit suitable for inverting data of the first coupler and transferring an inverted data to the third latch in response to the third strobe signal;
a fourth transfer unit suitable for inverting data of the second coupler and transferring an inverted data to the fourth latch in response to the fourth strobe signal;
a fifth transfer unit suitable for inverting data of the first coupler and transferring an inverted data to the first latch in response to the fifth strobe signal;
a sixth transfer unit suitable for inverting data of the second coupler and transferring an inverted data to the second latch in response to the sixth strobe signal;
a seventh transfer unit suitable for inverting data of the first coupler and transferring an inverted data to the third latch in response to the seventh strobe signal;
an eighth transfer unit suitable for inverting data of the second coupler and transferring an inverted data to the fourth latch in response to the eighth strobe signal;
a first driver suitable for driving an inverted data obtained by the first latch to the first data transfer line;
a second driver suitable for driving an inverted data obtained by the second latch to the second data transfer line;
a third driver suitable for driving an inverted data obtained by the third latch to the third data transfer line; and
a fourth driver suitable for driving an inverted data obtained by the fourth latch to the fourth data transfer line.

6. The integrated circuit chip of claim 5, wherein the second transfer circuit includes:
fifth and sixth latches;
a ninth transfer unit suitable for inverting data of the first data transfer line and transferring an inverted data to the fifth latch in response to the first strobe signal;
a 10th transfer unit suitable for inverting data of the second data transfer line and transferring an inverted data to the sixth latch in response to the second strobe signal;
a 11th transfer unit suitable for transferring data of the third data transfer line to the fifth latch in response to the third strobe signal;
a 12th transfer unit suitable for transferring data of the fourth data transfer line to the sixth latch in response to the fourth strobe signal;
a 13th transfer unit suitable for transferring data of the first data transfer line to the fifth latch in response to the fifth strobe signal;
a 14th transfer unit suitable for transferring data of the second data transfer line to the sixth latch in response to the sixth strobe signal;
a 15th transfer unit suitable for inverting data of the third data transfer line and transferring an inverted data to the fifth latch in response to the seventh strobe signal;
a 16th transfer unit suitable for inverting data of the fourth data transfer line and transferring an inverted data to the sixth latch in response to the eighth strobe signal;
a fifth driver suitable for driving an inverted data obtained by the fifth latch to the fifth data transfer line; and
a sixth driver suitable for driving an inverted data obtained by the sixth latch to the sixth data transfer line.

7. The integrated circuit chip of claim 1, wherein a pattern of the data loaded on the first coupler and the second coupler is different from a pattern of the data loaded on the first to fourth data transfer lines, and
a pattern of the data loaded on the first to fourth data transfer lines is different from a pattern of the data loaded on the fifth and sixth data transfer lines.

8. The integrated circuit chip of claim 1, further comprising:
a fourth transfer circuit suitable for performing a serial-to-parallel conversion onto data of the data node to produce a fourth conversion result and transferring the fourth conversion result to the fifth and sixth data transfer lines;
a fifth transfer circuit suitable for performing a serial-to-parallel conversion onto the data of the fifth and sixth data transfer lines to produce a fifth conversion result and transferring the fifth conversion result to the first to fourth data transfer lines; and
a sixth transfer circuit suitable for performing a parallel-to-serial conversion onto the data of the first to fourth data transfer lines to produce a sixth conversion result and transferring the sixth conversion result to the first coupler and the second coupler.

9. The integrated circuit chip of claim 8, wherein the first transfer circuit, the second transfer circuit, and the third transfer circuit are activated during a read operation, and
the fourth transfer circuit, the fifth transfer circuit, and the sixth transfer circuit are activated during a write operation.

10. The integrated circuit chip of claim 1, wherein the integrated circuit chip includes a base die of a high bandwidth memory (HBM).

11. A memory device, comprising:
a base die that includes a data node for transferring and receiving data to and from a host, and first and second couplers that are coupled to transfer lines for coupling data between stacked chips; and
one or more core dies that are stacked over the base die, transfer and receive data to and from the base die through the one or more transfer lines, and include a cell array for storing data,
wherein the base die includes:
a first transfer circuit suitable for performing a serial-to-parallel conversion onto data of the first coupler and the second coupler to produce a first conversion result and transferring the first conversion result to first to fourth data transfer lines where a portion of the data of the first coupler and the second coupler is inverted and transferred;
a second transfer circuit suitable for performing a parallel-to-serial conversion onto data of the first to fourth data transfer lines to produce a second conversion result and transferring the second conversion result to fifth and sixth data transfer lines where a portion of the data of the first to fourth data transfer lines is inverted and transferred; and a third transfer circuit suitable for performing a parallel-to-serial conversion onto data of the fifth and sixth data transfer lines to produce a third conversion result and transferring the third conversion result to the data node.

12. The memory device of claim 11, wherein the first transfer circuit transfers the data of the first coupler and the second coupler to the first to fourth data transfer lines based on first to eighth strobe signals that are activated at different moments, and the first transfer circuit transfers data corresponding to four strobe signals among the first to eighth strobe signals to the first to fourth data transfer lines without an inversion, and transfers data corresponding to the other four strobe signals among the first to eighth strobe signals to the first to fourth data transfer lines after inverting the data corresponding to the other four strobe signals.

13. The memory device of claim 12, wherein the second transfer circuit transfers the data of the first to fourth data transfer lines based on the first to eighth strobe signals that are activated at different moments to the fifth and sixth data transfer lines, and the second transfer circuit transfers the data corresponding to the four strobe signals among the first to eighth strobe signals to the fifth and sixth data transfer lines without an inversion and transfers the data corresponding to the other four strobe signals among the first to eighth strobe signals to the fifth and sixth data transfer lines after inverting the data corresponding to the other four strobe signals.

14. The memory device of claim 13, wherein the second transfer circuit inverts the data that are inverted and transferred by the first transfer circuit.

* * * * *